United States Patent
Li et al.

(10) Patent No.: US 6,468,917 B1
(45) Date of Patent: Oct. 22, 2002

(54) METHOD FOR MODIFYING A C4 SEMICONDUCTOR DEVICE

(75) Inventors: Susan Xia Li, Fremont; Arnold Louie, Cupertino; Maria Guardado, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/502,916

(22) Filed: Feb. 10, 2000

Related U.S. Application Data

(60) Provisional application No. 60/168,190, filed on Nov. 30, 1999.

(51) Int. Cl.$^7$ .............................................. H01L 21/302
(52) U.S. Cl. ...................... 438/712; 438/714; 438/723; 438/725; 438/745
(58) Field of Search ................ 438/712, 714, 438/725, 723, 745; 257/738

(56) References Cited

U.S. PATENT DOCUMENTS

| | | | | |
|---|---|---|---|---|
| 5,110,712 A | * | 5/1992 | Kessler et al. | 438/623 |
| 5,869,899 A | * | 2/1999 | Arledge et al. | 257/738 |
| 5,938,856 A | * | 8/1999 | Sachdev et al. | 134/1.3 |
| 6,074,895 A | * | 6/2000 | Dery et al. | 438/108 |
| 6,159,754 A | * | 12/2000 | Li et al. | 438/4 |

* cited by examiner

Primary Examiner—Benjamin L. Utech
Assistant Examiner—Binh X Tran
(74) Attorney, Agent, or Firm—Sawyer Law Group LLP

(57) ABSTRACT

The present invention provides a method for modifying a C4 device, the device including a circuit, a polyimide layer, and a plurality of solder bumps in the active region of the C4 device. The method includes removing the polyimide layer using a plasma etch, the plasma etch comprising a mixture of oxygen and an inert gas; modifying the circuit; and cleaning the modified C4 device with a reactive flux. By mixing the oxygen with an inert gas, the oxidation of the solder bumps due to the plasma etch are reduced. Because the top layer features are now readily visible, circuit structures are more easily located, and modification can be more easily performed and with more accuracy. In the preferred embodiment, the device is then cleaned with a reactive flux, which removes any oxidation layer which has formed on the solder bumps. In this manner, circuit modification may be performed more quickly while also minimizing the oxidation of the solder bumps. The reduced oxidation of the solder bumps will help the C4 packaging process to be successful for electrical testing after focused beam ion (FIB) modification. Also, since the costly FIB process is not required to locally remove the polyimide layer for locating circuit structures, the cost of device fabrication is reduced.

5 Claims, 4 Drawing Sheets

METHOD FOR MODIFYING A C4 SEMICONDUCTOR DEVICE

This application claims benefit of provisional application No. 60/168,180 filed No. 30, 1999.

FIELD OF THE INVENTION

The present invention relates to semiconductor devices, and more particularly to the modification of semiconductor devices.

BACKGROUND OF THE INVENTION

The modification and verification of circuit design changes is a part of the normal fabrication process of semiconductor devices, including the fabrication of controlled collapse chip connection (C4) devices. FIGS. 1A and 1B illustrate cross-sectional and top views of a conventional C4 device, respectively. As illustrated in FIG. 1A, the C4 device 100 includes a die 102 with an active region 104 on one side. The active region 104 contains the circuitry of the device 100 and is connected to a package substrate 106 via a plurality of solder bumps 108. In the current state of the art, the size of the circuit structures in the active region 104 are in the sub-micron range. The active region 104 may be protected by a layer of polyimide (not shown). On the other side of the package substrate 106 are pins 110 which connect the C4 device to a printed circuit board (not shown). As illustrated in FIG. 1B, the package substrate 106 contain footprints 112 composed of solder. The locations of the footprints 112 correspond to the solder bumps 108 on the active region 104.

When circuit modification is required before packaging, the die 102 with solder bumps 108 is removed from a whole wafer which has been sawed into single die pieces. A focused ion beam (FIB) can be used to cut and deposit metal in the desired locations. Circuit structures on semiconductor devices may be located by obtaining a scanning electron microscope (SEM) image of the top layer of the circuit, and then using the SEM image of the top layer as a reference to align a circuit layout. However, since the active region 104 is covered by a polyimide layer, the SEM image of the top layer is featureless. Thus, as illustrated in FIG. 2, in order to find circuit structures, first a section of the polyimide layer 114 needs to be removed by the FIB to expose a portion 116 of the top layer. The exposed portion 116 can then be used as a reference for locating the desired circuit structures. Circuit modification at the desired locations may then be performed.

However, the removal of the portion of the polyimide layer 114 using the FIB is time consuming. The FIB is also a very costly system. The use of the FIB in this time consuming manner increases the cost of device fabrication and the time of the new device introduction to the market.

Accordingly, there exists a need for an improved method for modifying a C4 device. The method should be easy to implement, and reduce the cost and increase the accuracy of the circuit modification. The present invention addresses such a need.

SUMMARY OF THE INVENTION

The present invention provides a method for modifying a C4 device, the device including a circuit, a polyimide layer, and a plurality of solder bumps in the active region of the C4 device. The method includes removing the polyimide layer using a plasma etch, the plasma etch comprising a mixture of oxygen and an inert gas; modifying the circuit; and cleaning the modified C4 device with a reactive flux. By mixing the oxygen with an inert gas, the oxidation of the solder bumps due to the plasma etch are reduced. Because the top layer features are now readily visible, circuit structures are more easily located, and modification can be more easily performed and with more accuracy. In the preferred embodiment, the device is then cleaned with a reactive flux, which removes any oxidation layer which has formed on the solder bumps. In this manner, circuit modification may be performed more quickly while also minimizing the oxidation of the solder bumps. The reduced oxidation of the solder bumps will help the C4 packaging process to be successful for electrical testing after focused beam ion (FIB) modification. Also, since the costly FIB process is not required to locally remove the polyimide layer for locating circuit structures, the cost of device fabrication is reduced.

DETAILED DESCRIPTION

The present invention provides an improved method for modifying a controlled collapse chip connection (C4) device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The method in accordance with the present invention improves C4 device modification by removing the polyimide layer to show the top layer features of the circuitry. Because the top layer features are now readily visible, circuit structures can be more easily located, and circuit modification can be more easily performed and with more accuracy. However, the removal of the polyimide layer creates another problem. Polyimide is typically removed using a Reactive-Ion-Etch (RIE) type plasma etch with pure oxygen gas ($O_2$) as the etchant. But because $O_2$ is a strong oxidizer, it is very reactive to the solder bumps as well. As a result, the oxidized solder bumps cannot be reflowed properly to form a good connection with the footprints on the package substrate.

The method in accordance with the present invention solves this problem by using a plasma etch which contains a mixture of $O_2$ and an inert gas to remove the polyimide layer and by using a reactive flux to clean the device after circuit modification. By mixing $O_2$ with an inert gas, the removal of the polyimide is buffered, reducing the amount oxidation of the solder bumps. However, some amount of oxidation will inevitable occur. Thus, the circuitry is then cleaned with the reactive flux, which removes whatever oxidation layer has formed on the solder bumps. In this manner, circuit modification may be performed more quickly while also minimizing the oxidation of the solder bumps. Also, since the costly FIB process is not required to locally remove the polyimide layer for locating circuit structures, the cost of device fabrication is reduced.

To more particularly describe the features of the present invention, please refer to FIGS. 3 through 4C in conjunction with the discussion below.

Figure 1A:
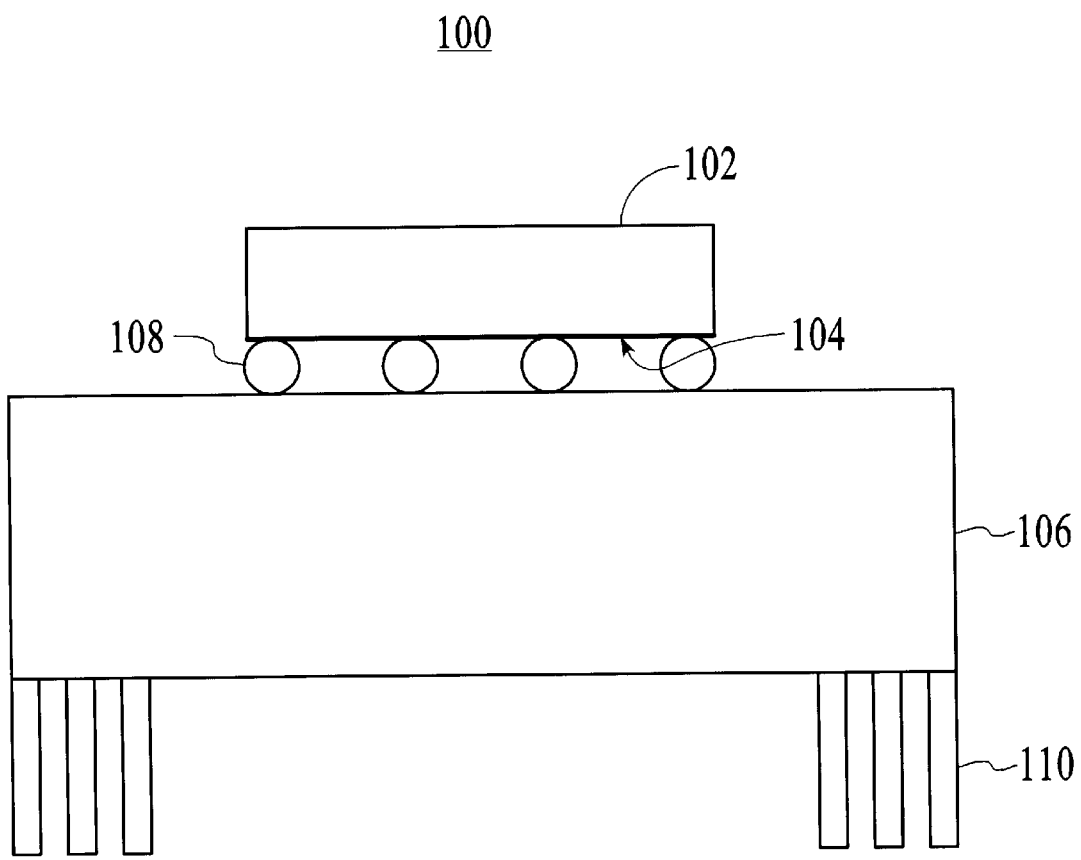
FIGS. 1A and 1B illustrate cross-sectional and top views of a conventional controlled collapse chip connection (C4) device.
Figure 1B:
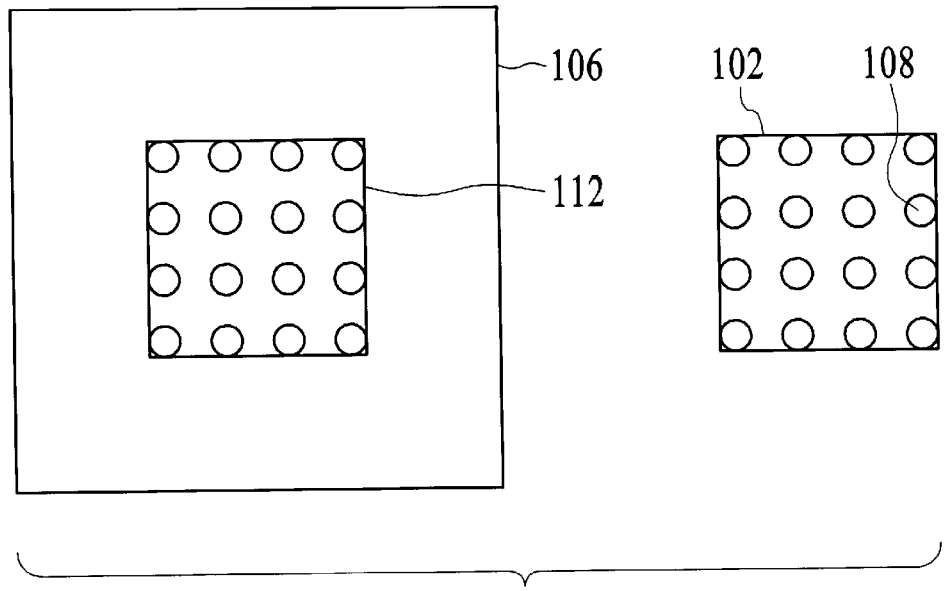
Figure 2:
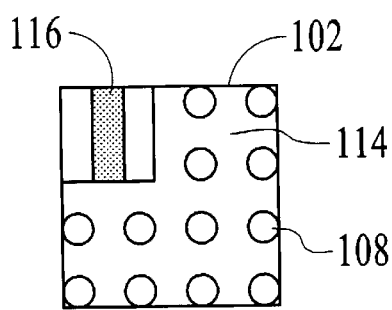
FIG. 2 illustrates a conventional method of performing circuit modification of a C4 device.
Figure 3:
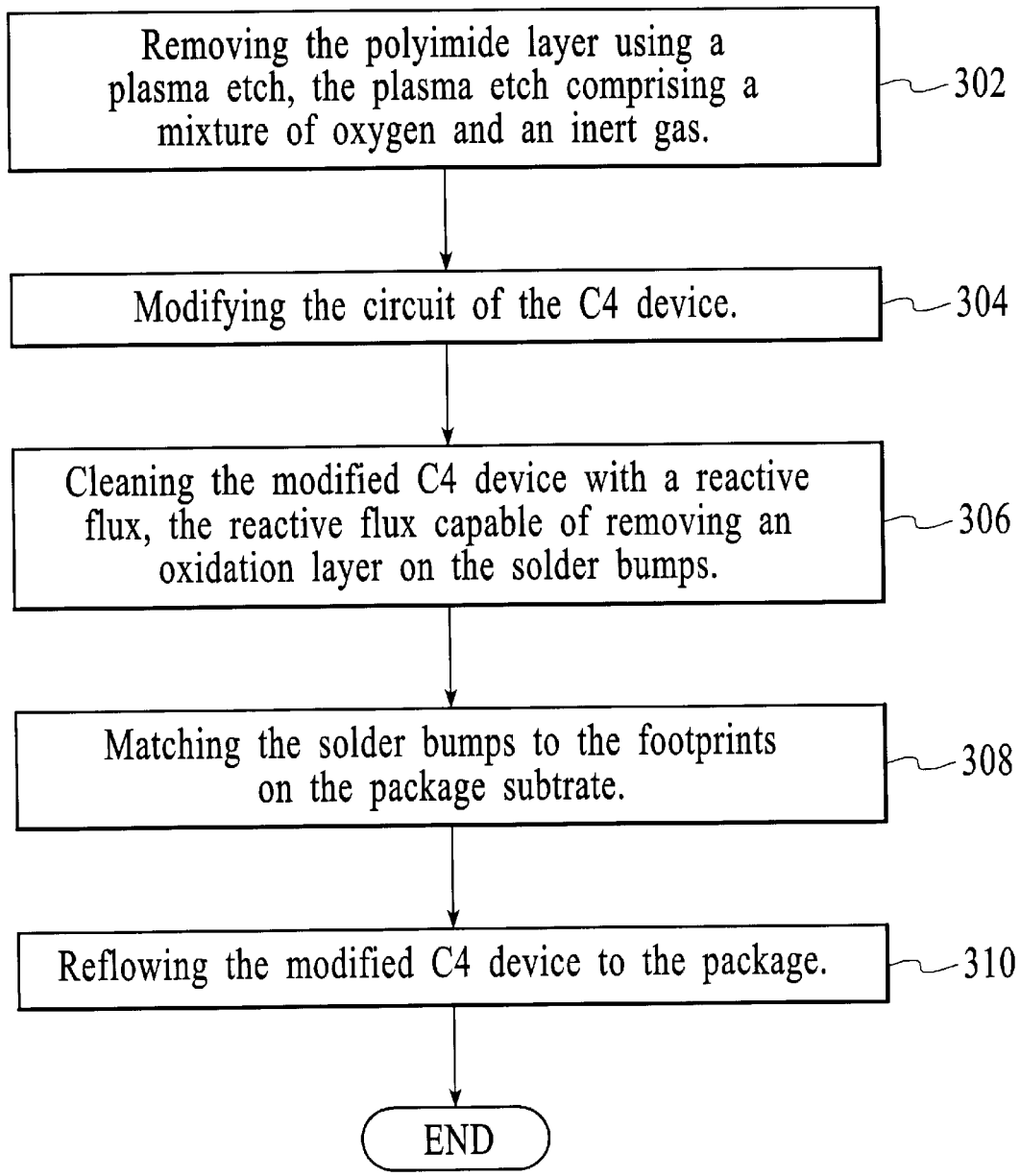
FIG. 3 is a flow chart illustrating a preferred embodiment of a method for modifying a C4 device in accordance with the present invention.

FIG. 3 is a flow chart illustrating a preferred embodiment of a method for modifying a C4 device in accordance with the present invention. First, the polyimide layer is removed using a plasma etch which comprises a mixture of $O_2$ and an inert gas, via step 302. Because the inert gas is mixed with the $O_2$, oxidation of the solder bumps are reduced. The topography of the top layer of the circuitry is now showing. Next, the circuit of the C4 device is modified, via step 304. Conventional modification techniques, such as the use of the FIB, may be used. Once modified, the C4 device is cleaned with a reactive flux, via step 306. The reactive flux removes the oxidation layer on the solder bumps. The solder bumps are then matched to the footprints on the package substrate, via step 308. The entire device is then reflowed, via step 310, to melt the solder bumps and the footprints together to package the device.

Figure 4A:
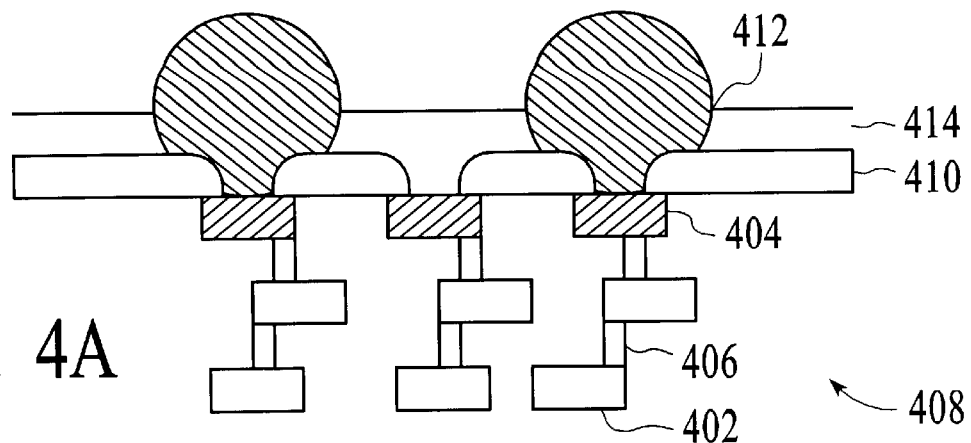
FIGS. 4A–4C illustrate cross-sectional views of the top layers of a C4 device in demonstration of the preferred embodiment of the method for modifying a C4 device in accordance with the present invention.
Figure 4B:
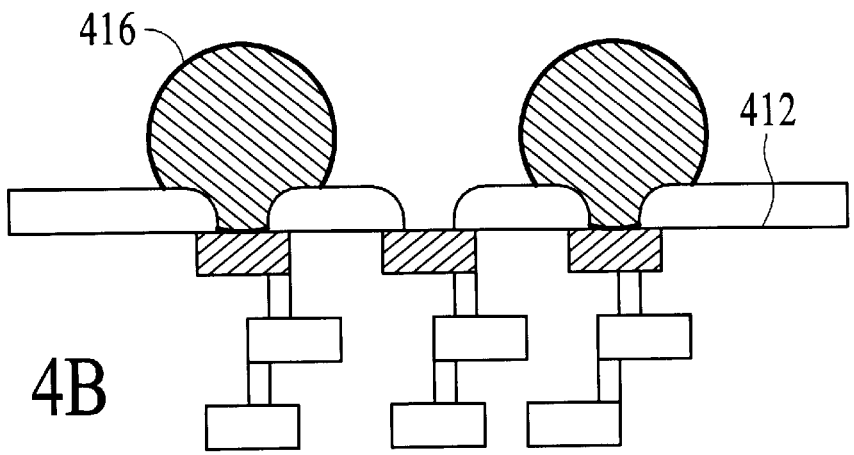
Figure 4C:
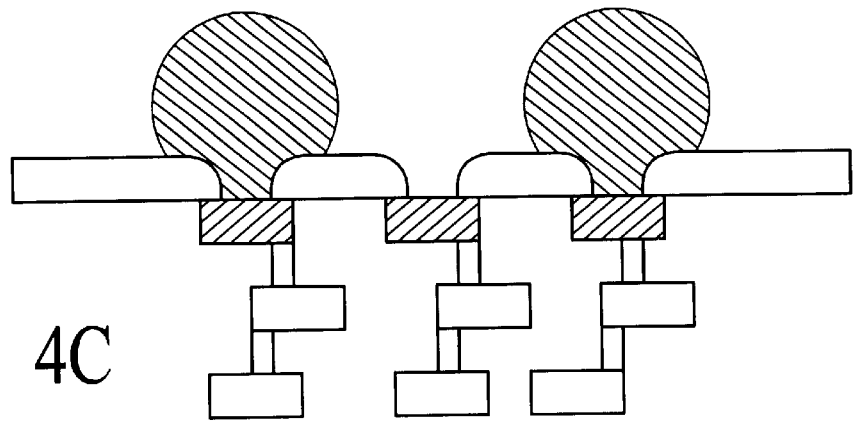

FIGS. 4A–4C illustrate cross-sectional views of the top layers of a C4 device in demonstration of the preferred embodiment of the method for modifying a C4 device in accordance with the present invention. As illustrated in FIG. 4A, the circuitry comprises a plurality of metal lines 402 in metal layers with a top metal layer 404, via connections 406 between metal lines in different layers, and interlayer dielectric 408 between the metal layers. At the very top is a topside layer 410 which typically comprises silicon nitride and silicon dioxide. Holes are made in the topside layer 410 where solder bumps 412 are placed at select holes. A layer of polyimide 414 covers the circuitry to protect it.

First, the polyimide layer 414 is removed using a plasma etch, via step 302. In the preferred embodiment, the plasma etch comprises approximately 30% argon (Ar) and approximately 70% oxygen. By removing the polyimide layer 414, the features of the top layer 404 can be easily viewed by SEM. Alignment of the circuit layout can be more easily done using these recognizable features. Faster circuit modification can be performed at desired locations, via step 304.

FIG. 4B illustrates the top layers after the removal of the polyimide layer 414. Because the plasma etch is performed with a mixture of Ar and $O_2$, the etch is performed more slowly than if pure $O_2$ was used. In addition, the etching power is reduced from the conventional 250W to approximately 100W. The resulting etching time is increased from 10–15 minutes to approximately 20–25 minutes. By buffering the etch of the polyimide layer 414 in this manner, the oxidation of the solder bumps 412 is significantly reduced.

However, some amount of oxidation will inevitably occur. Thus, a thin oxidation layer 414 is formed on the solder bumps 410. This oxidation layer 414 may increase the difficulty of connecting the solder bumps 412 with the footprints on the package substrate. Thus, the device is then cleaned with a reactive flux, via step 306. The reactive flux removes the oxidation layer 416 on the solder bumps 412. FIG. 4C illustrate the top layers after cleaning with the reactive reflux. An example of a reactive flux is the Rosin Mildly Activated (RMA) Flux. The die may now be suc-cessfully packaged by matching the solder bumps 412 to the footprints on the package substrate, via step 308, and then reflowing them, via step 310. The device may now be tested to verify electrical functionality.

Although the method in accordance with present invention is described with both the $O_2$ and Ar mixture plasma etch and the cleaning with the reactive flux, one of ordinary skill in the art will understand that circuit modification may be performed with the plasma etch as described without the reactive flux, or with the reactive flux without the plasma etch, and still be within the spirit and scope of the present invention.

An improved method for modifying a C4 device has been disclosed. The method in accordance with the present invention improves C4 device modification by removing the polyimide layer to expose the top layer features of the circuitry, using a plasma etch comprising oxygen and an inert gas. By mixing the oxygen with an inert gas, the oxidation of the solder bumps due to the plasma etch are reduced. Because the top layer features are now readily visible, circuit structures are more easily located, and modification can be more easily performed and with more accuracy. The device is then cleaned with a reactive flux, which removes any oxidation layer which has formed on the solder bumps. In this manner, circuit modification may be performed more quickly while also minimizing the oxidation of the solder bumps. Also, since the costly FIB process is not required to locally remove the polyimide for locating circuit structures, the cost of device fabrication is reduced.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for modifying a C4 device, the device including a circuit, a polyimide layer covering the circuit, and a plurality of solder bumps in the active region of the C4 device, comprising the steps of:

(a) removing all of the polyimide layer on the circuit using a plasma etch, the plasma etch comprising a mixture of oxygen and an inert gas, wherein the removing forms an oxidation layer on the plurality of bumps, wherein the removing exposes the circuit covered by the polyimide layer;

(b) modifying the circuit that was covered by the removed polyimide layer; and (c) cleaning the modified C4 device with a reactive flux, the reactive flux capable of removing the oxidation layer on the plurality of solder bumps.

2. The method of claim 1, wherein the modifying step (b) is performed with a focused ion beam (FIB).

3. The method of claim 1, further comprising:

(d) matching the plurality of solder bumps to a footprint on a package substrate; and (e) reflowing the modified C4 device.

4. The method of claim 1, wherein the plasma etch comprises approximately 30% argon and approximately 70% oxygen.

5. The method of claim 4, wherein the plasma etch is performed at approximately 100W for approximately 20–25 minutes.

\* \* \* \* \*